(12) United States Patent
Kamada et al.

(10) Patent No.: US 10,903,716 B2
(45) Date of Patent: Jan. 26, 2021

(54) ELECTRIC WORKING MACHINE

(71) Applicant: MAKITA CORPORATION, Anjo (JP)

(72) Inventors: Masaki Kamada, Anjo (JP); Fujio Nakano, Anjo (JP)

(73) Assignee: MAKITA CORPORATION, Anjo (JP)

( * ) Notice: Subject to any disclaimer, the term of this patent is extended or adjusted under 35 U.S.C. 154(b) by 210 days.

(21) Appl. No.: 16/135,490

(22) Filed: Sep. 19, 2018

(65) Prior Publication Data

US 2019/0103784 A1    Apr. 4, 2019

(30) Foreign Application Priority Data

Sep. 29, 2017 (JP) .................. 2017-191347

(51) Int. Cl.
  *H02K 5/24*  (2006.01)
  *H02K 7/14*  (2006.01)
  *H02K 11/40*  (2016.01)
  *H02K 5/22*  (2006.01)
  *H05K 1/18*  (2006.01)
  *B25F 5/02*  (2006.01)
  *B25F 5/00*  (2006.01)
  (Continued)

(52) U.S. Cl.
  CPC ............. *H02K 5/24* (2013.01); *B25F 5/008* (2013.01); *B25F 5/02* (2013.01); *H02K 5/225* (2013.01); *H02K 7/145* (2013.01); *H02K 11/02* (2013.01); *H02K 11/026* (2013.01); *H02K 11/40* (2016.01); *H05K 1/181* (2013.01); *H02K 5/143* (2013.01); *H05K 2201/10015* (2013.01)

(58) Field of Classification Search
  CPC .......... H02K 5/24; H02K 11/02; H02K 11/40; H02K 5/225; H02K 11/026; H02K 5/143; H05K 1/181
  See application file for complete search history.

(56) References Cited

U.S. PATENT DOCUMENTS 5,942,819 A * 8/1999 Burgess ................. H02K 11/40
                                                   310/239
8,552,615 B2 * 10/2013 Zhao .................... H02K 11/026
                                                   310/239
(Continued)

FOREIGN PATENT DOCUMENTS

JP           H08-196 U         2/1996

*Primary Examiner* — Bernard Rojas
(74) *Attorney, Agent, or Firm* — Oliff PLC

(57) ABSTRACT

An electric working machine includes a motor, a circuit board having capacitors and choke coils for noise reduction, and a fixing tool for fixing the circuit board to a portion of a case of the motor including motor terminals for power feed. The circuit board includes input terminal members to receive an externally supplied driving power, and a ground connection member electrically coupled to the portion of the case. The capacitors couple the input terminal members to the ground connection member. The choke coils couple the input terminal members to the motor terminals. The ground connection member is arranged in a certain area of the circuit board, which is one of areas on the circuit board defined by dividing the circuit board with a straight line crossing a rotational shaft and is an area where the input terminal members are located. The capacitors are mounted in the certain area.

19 Claims, 8 Drawing Sheets

(51) Int. Cl.
*H02K 11/02* (2016.01)
*H02K 11/026* (2016.01)
*H02K 5/14* (2006.01)

(56) References Cited

U.S. PATENT DOCUMENTS

| | | | | |
|---|---|---|---|---|
| 2010/0320854 | A1* | 12/2010 | Yamazaki | H02K 5/148 |
| | | | | 310/72 |
| 2012/0098361 | A1* | 4/2012 | Yamasaki | H02K 11/33 |
| | | | | 310/52 |
| 2013/0214626 | A1* | 8/2013 | Lee | H02K 11/026 |
| | | | | 310/72 |
| 2014/0306791 | A1* | 10/2014 | Kanazawa | H01F 27/06 |
| | | | | 336/199 |
| 2014/0356200 | A1* | 12/2014 | Chan | H02K 5/145 |
| | | | | 417/423.7 |
| 2018/0115293 | A1* | 4/2018 | Yamamoto | H05K 1/181 |

* cited by examiner

ELECTRIC WORKING MACHINE

CROSS-REFERENCE TO RELATED APPLICATIONS

This application claims the benefit of Japanese Patent Application No. 2017-191347 filed Sep. 29, 2017 in the Japan Patent Office, the disclosure of which is incorporated herein by reference.

BACKGROUND

The present disclosure relates to an electric working machine that includes a motor with a noise reduction function.

Conventionally, a motor used as a power source in an electric working machine is generally equipped with a circuit board that includes a noise cancelling circuit for reducing noise caused during a drive of a motor.

As disclosed in, for example, Japanese Unexamined Utility Model Application Publication No. H08-000196 (Patent Document 1), this type of circuit board can be attached to a portion of a case of a motor situated in one end of the motor in an axial direction of a rotational shaft of the motor. The circuit board in this example includes, as conductor patterns, two input terminals that receive a direct current voltage to be applied to motor terminals, and a ground terminal that is coupled to the case of the motor.

The circuit board includes, as noise cancellation elements, choke coils that couple the two input terminals to the motor terminals respectively, and capacitors that couple the input terminals to the ground terminal respectively.

SUMMARY

In the electric working machine in the aforementioned example, noise cancellation elements such as the choke coils and the capacitors are mounted on the circuit board, and the circuit board is fixed to the motor. This can help reduce disconnection or damage of the noise cancellation elements due to a vibration of the electric working machine or an externally imposed impact.

The input terminals and the ground terminal are arranged in opposing ends of the circuit board across the rotational shaft of the motor. The capacitors are situated between the input terminals and the ground terminal via wiring patterns that extend from the input terminals to the ground terminal.

There has been a problem in the aforementioned circuit configuration that the wirings for mounting the capacitors on the circuit board tend to be long, and impedance of the wirings compromises the noise reduction effect. In addition, since capacitors having lead wires are used conventionally, impedance of their lead wires also compromises the noise reduction effect.

Preferably, one aspect of the present disclosure obtains a desired noise reduction effect in an electric working machine that includes a motor with a noise reduction function by shortening the length of wirings of noise cancellation elements in a circuit board arranged in the motor for noise reduction.

An electric working machine in one aspect of the present disclosure includes a motor, a circuit board mounted with capacitors and choke coils for noise reduction, and a fixing tool configured to fix the circuit board to a portion of a case of the motor, the portion of the case being located in one end of the motor in an axial direction of a rotational shaft of the motor and including motor terminals for power supply.

The circuit board includes input terminal members and a ground connection member as conductor patterns. The input terminal members may include input terminals configured to receive an externally supplied driving power for the motor. The ground connection member is configured to be electrically coupled to a portion of the case in an area opposite another area, in which the input terminal members are located, across the rotational shaft of the motor.

The capacitors are mounted on the circuit board to couple the input terminal members to the ground connection member respectively. The choke coils are mounted on the circuit board to couple the input terminal members to the motor terminals respectively.

The ground connection member is arranged in a certain area of the circuit board, which is one of areas on the circuit board defined by dividing the circuit board with a straight line that crosses the rotational shaft of the motor and is an area where the input terminal members are located. The capacitors are mounted in the certain area where the input terminal members are located.

Thus, unlike the conventional electric working machines, the capacitors of the electric working machine in the present disclosure can be mounted on the circuit board without extending the conductor patterns of the input terminal members, which may include the input terminals, to the ground connection member. This helps shorten the length of the wirings of the capacitors. Consequently, the electric working machine in the present disclosure can reduce a rise in impedance of the wirings of the capacitors and improve the noise reduction effect.

In the present disclosure, if a chip component without a lead wire is used as each of the capacitors in the electric working machine, then the impedance due to lead elements of the capacitors can be further reduced, which then helps improve the noise reduction effect.

The circuit board may include, as conductor patterns, terminal-connecting parts coupled to the motor terminals via contact elements respectively. In this configuration, the choke coils can be mounted on the circuit board to couple the input terminal members to the terminal-connecting parts respectively.

This can facilitate the coupling of the choke coils compared with a case where the choke coils are directly coupled to the motor terminals after fixing the circuit board to the motor without disposing the terminal-connecting parts on the circuit board.

The choke coils may include rod-shaped cores wound with conductive wires and may be arranged to couple the input terminal members and the terminal-connecting parts in the minimum length of straight lines respectively. This helps shorten the length of the wiring patterns or the lead wires for mounting the choke coils and reduce the rise of the impedance of the wiring patterns or the lead elements.

The fixing tool includes a conductor. The ground connection member of the circuit board may be electrically coupled to the portion of the case of the motor via the fixing tool.

In this configuration, the circuit board may include a conductor pattern on its back surface opposite from its front surface where the capacitors and the choke coils are mounted, the conductor pattern being electrically coupled to the ground connection member on the front surface of the circuit board, so that the conductor pattern on the back surface contacts the fixing tool as the circuit board is mounted on the fixing tool.

With this configuration, the conductor pattern on the back surface of the circuit board is coupled to the fixing tool by mounting the circuit board on the fixing tool. This causes the ground connection member to be electrically coupled to the portion of the case of the motor, highly facilitating the coupling of the ground connection member to the portion of the case of the motor.

The circuit board may be fixed to the fixing tool via a screw that is inserted through a screw hole formed in the ground connection member. This causes the ground connection member to be electrically coupled to the fixing tool via the screw, which can reduce electrical disconnection due to factors such as vibrations.

To increase reliability of the electric connection between the circuit board and the fixing tool, an intervening substance for supporting the electric connection may be disposed between the circuit board and the fixing tool. This enables a reduction of the impedance of connected portions of the circuit board and the fixing tool, which leads to an increase in the noise reduction effect.

The fixing tool includes a fitting frame that can be externally fitted to the portion of the case of the motor. The fixing tool may be configured to be fixed to the motor by press-fitting the portion of the case of the motor into the fitting frame. Fixing work of the fixing tool to the motor can therefore be highly facilitated.

In this configuration, a rib may be disposed inside the fitting frame. The rib may be configured to abut an end face of the case of the motor when the portion of the case is press-fitted into the fitting frame so as to create a space between the fixing tool and the motor to provide a passage for a cooling air. This can reduce an increase of motor temperature due to the heat confined between the motor and the fixing tool when the motor is fixed to the fixing tool.

BRIEF DESCRIPTION OF THE DRAWINGS

An example embodiment of the present disclosure will be described hereinafter with reference to the accompanying drawings, in which.

DETAILED DESCRIPTION OF THE PREFERRED EMBODIMENTS

Embodiment

In the present embodiment, a power tool 1 will be explained as an example of the electric working machine in the present disclosure.

Figure 1:
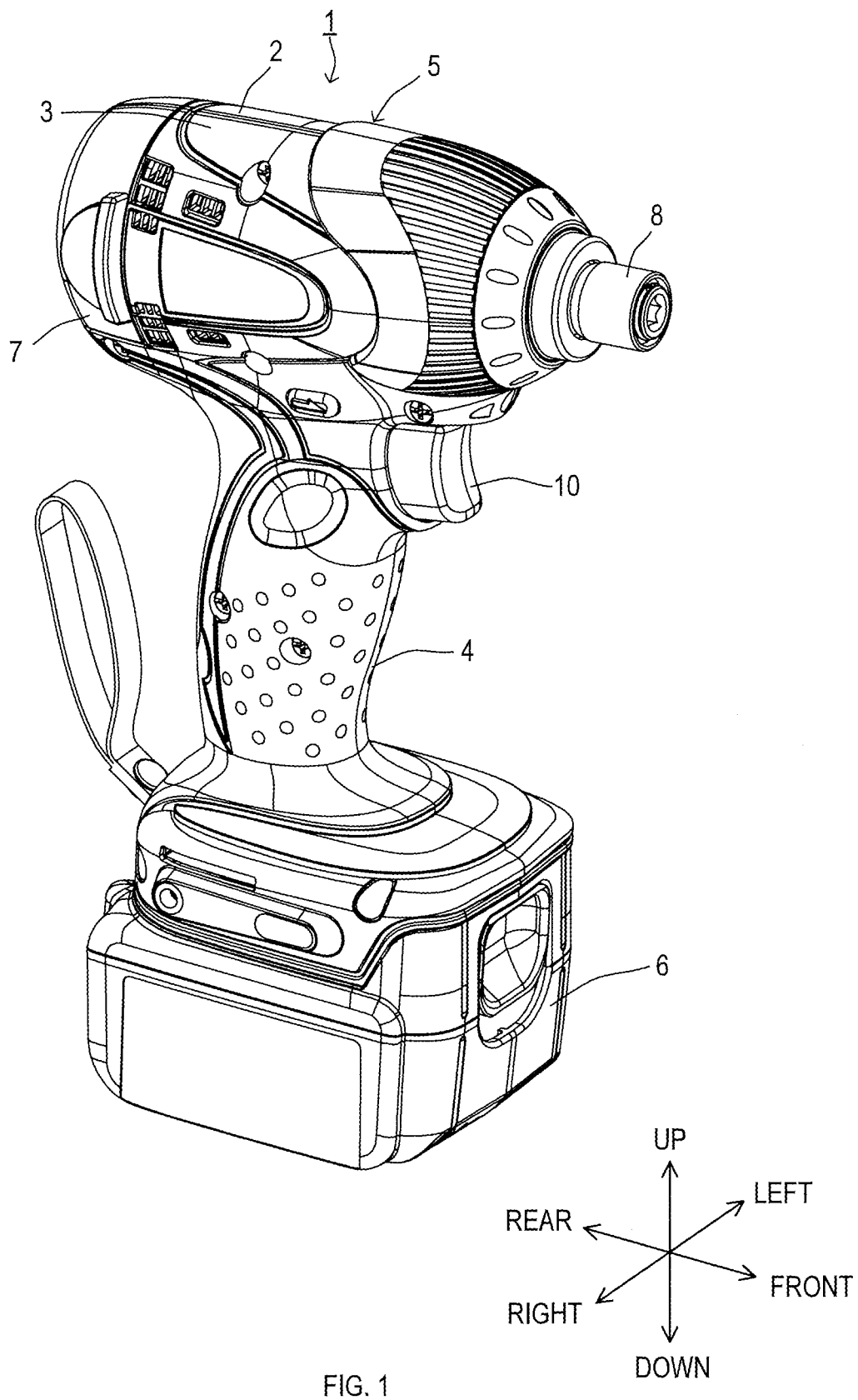
FIG. 1 is a perspective view showing an exterior appearance of an electric working machine in an embodiment.

As shown in FIG. 1, the power tool 1 in the present embodiment is a rechargeable impact driver including a main body housing 5, which is constructed by assembling a first half-housing 2 on the left side and a second half-housing 3 on the right side together and which includes a grip 4 extending downward. A battery pack 6 is detachably attached to a lower end of the grip 4 of the main body housing 5.

A motor housing 7 is disposed on a rear side of the main body housing 5. The motor housing 7 houses the motor 20 that is a power source for the power tool 1 (see FIG. 2 to FIG. 7). A speed reducer and an impact mechanism are housed in front of the motor housing 7.

A chuck sleeve 8 is situated at a leading end of the main body housing 5. The chuck sleeve 8 is configured for attachment of various tool bits, such as a driver bit and a socket bit (not illustrated), to a tip of the impact mechanism.

The impact mechanism includes, for example, a spindle that is rotated via the speed reducer, a hammer that is rotated together with the spindle and movable along the rotational shaft, and an anvil that is situated in front of the hammer. A tip of the anvil is designed for the attachment of the tool bit.

In the impact mechanism, the spindle is rotated due to the rotation of the motor 20, the rotation of the spindle causes the anvil to rotate via the hammer, and the rotation of the anvil causes the chuck sleeve 8 (and thus the tool bit) to rotate.

As a load imposed on the anvil increases as screw tightening by the tool bit progresses, the hammer moves rearward against a biasing force of a coil spring and is disengaged from the anvil. The hammer then rotates with the spindle and moves forward due to the biasing force of the coil spring to re-engage with the anvil.

This results in providing intermittent impacts to the anvil for additional tightening of the screw by the tool bit. Since such an impact mechanism is conventionally known, detailed explanations will be omitted here.

The grip 4 is a component for a user to grip when using the power tool 1. A trigger switch 10 is located above the grip 4. The trigger switch 10 is brought into an ON-state in response to a pulling manipulation by the user. The trigger switch 10 includes a variable resistor whose resistance value varies depending on the pulled amount of the trigger switch 10 (amount of manipulation on the trigger switch 10).

As the trigger switch 10 is brought into the ON-state, an electric power corresponding to the pulled amount of the trigger switch 10 is supplied from a drive circuit housed inside the grip 4 to the motor 20, and the motor 20 rotates.

The motor 20 includes a well-known direct current (DC) motor, which includes a cylindrical case 22 that houses magnets, an armature, brushes, and the like.

Figure 2:
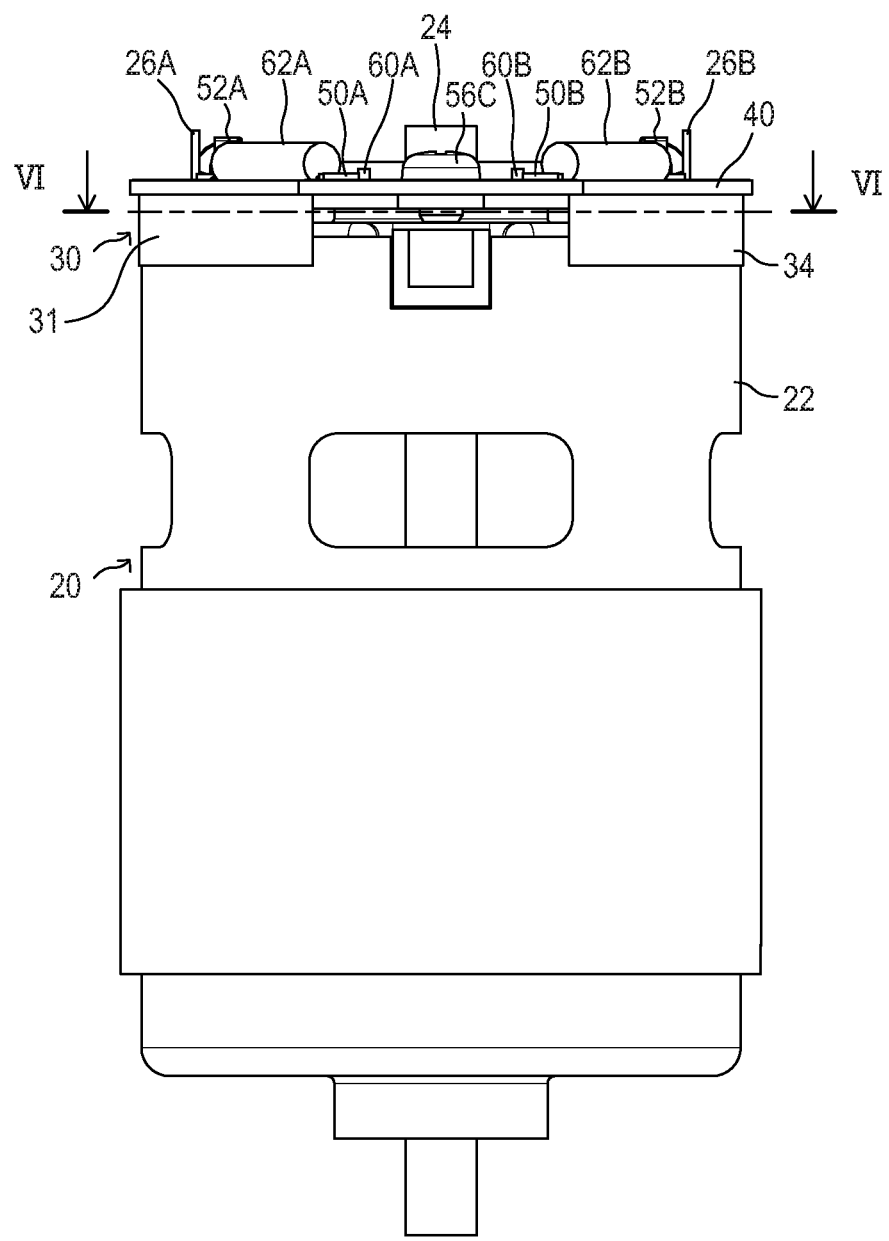
FIG. 2 is a side view of a motor installed inside the electric working machine in the embodiment, taken orthogonally to a rotational shaft of the motor.
Figure 3:
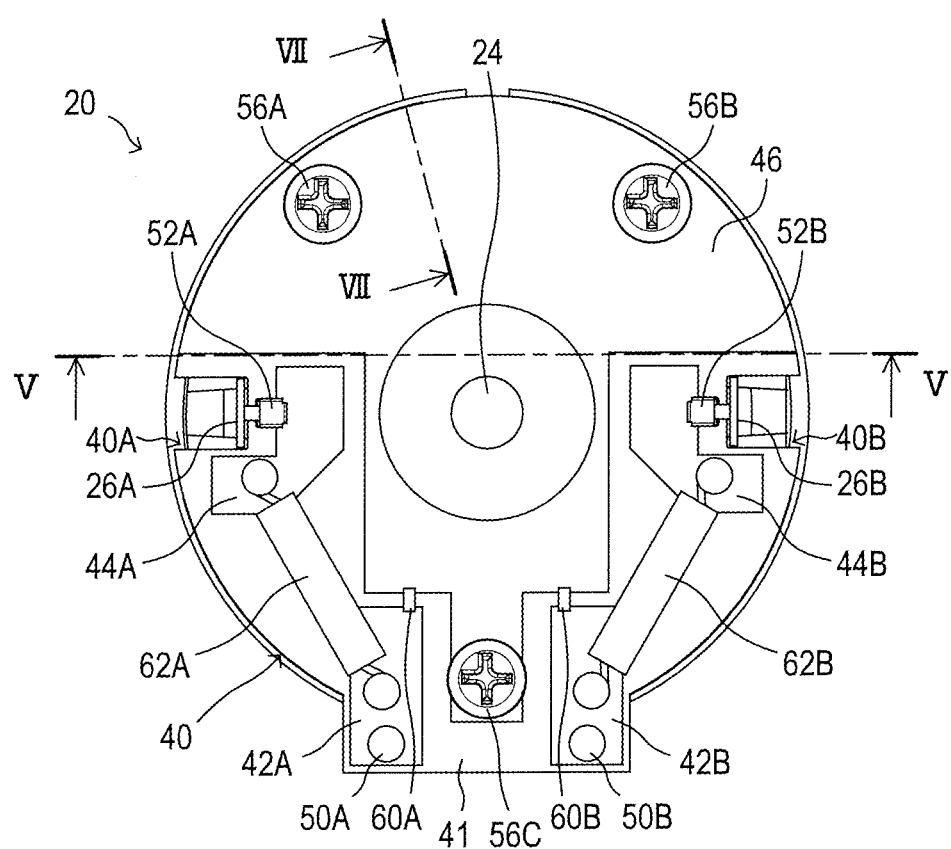
FIG. 3 is a plan view of the motor shown in FIG. 2, taken from a motor terminal side.
Figure 4:
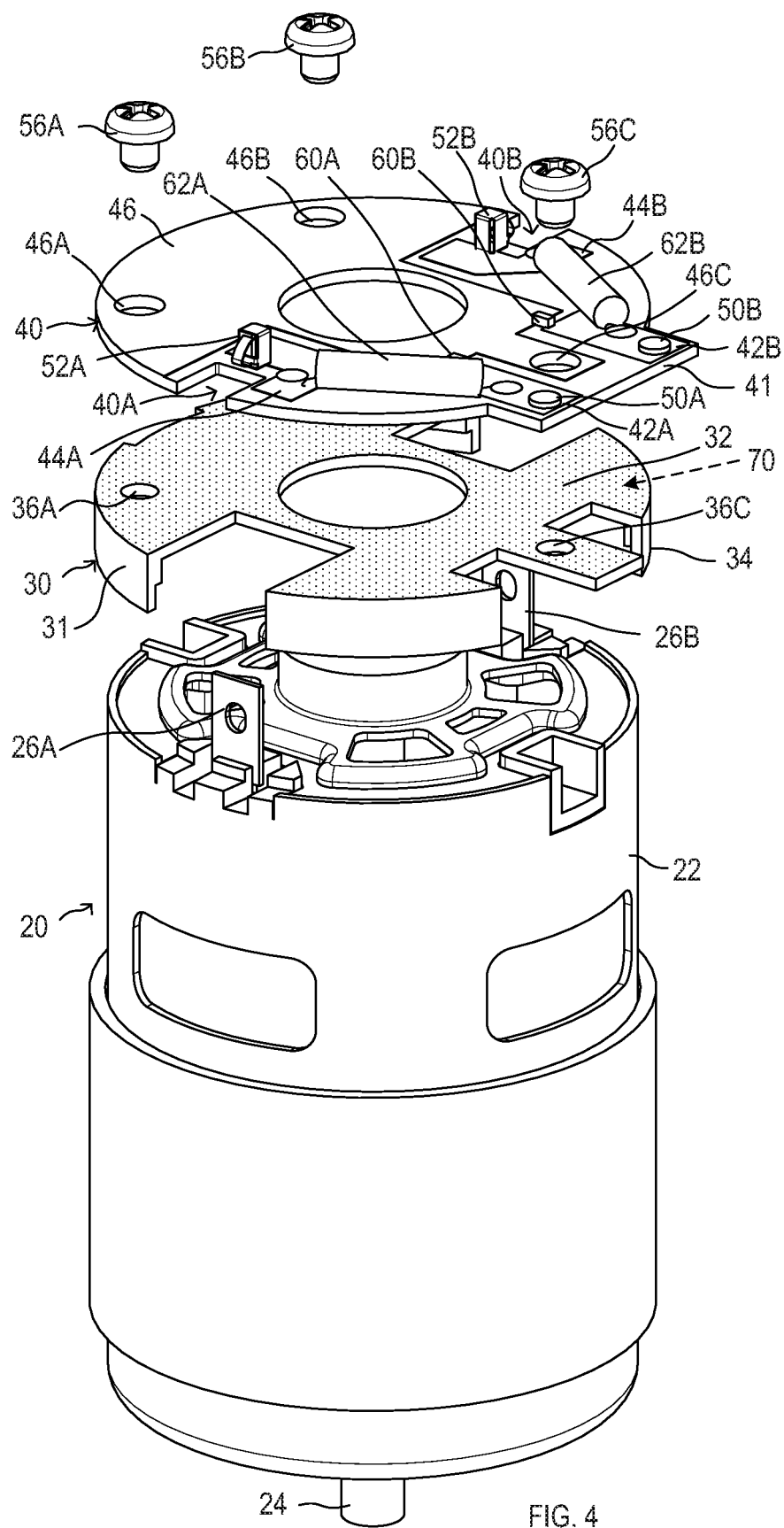
FIG. 4 is an exploded perspective view showing a circuit board and a fixing tool taken apart from the motor shown in FIG. 2.

As shown in FIG. 2, FIG. 3, and FIG. 4, the case 22 has a first end (also known as a terminal end, a circuit board end, or a top end) in one end of the motor 20 in an axial direction of a rotational shaft 24, and the first end includes a first motor terminal 26A and a second motor terminal 26B that are disposed opposite to each other across the rotational shaft 24.

The first and second motor terminals 26A and 26B externally protrude from the first end of the case 22. A circuit board 40 is fixed to the first end of the case 22, via a fixing tool 30 that is arranged to cover the end face of the first end of the case 22.

As shown in FIGS. 2 and 4-6, the fixing tool 30 includes an electrically conductive metallic material 31 that is fixed to the case 22 and thus electrically coupled to the case 22.

The circuit board 40 includes a first input terminal 50A and a second input terminal 50B that are configured to input a DC voltage for driving the motor 20 from the drive circuit housed inside the grip 4.

A first input terminal member 42A, a second input terminal member 42B, a first terminal-connecting part 44A, a second terminal-connecting part 44B, and a ground connection member 46 are layered on a front surface of the circuit board 40, which is not facing the case 22, as conductor patterns. The first input terminal 50A is arranged on the first input terminal member 42A, and the second input terminal 50B is arranged on the second input terminal member 42B.

The circuit board 40 has approximately a disc shape that corresponds to the shape of the end face of the case 22 of the motor 20. A part of the perimeter of the disc shape protrudes outwardly to form an attachment 41 for the first and second input terminals 50A and 50B. The first and second input terminal members 42A and 42B are arranged parallel to each other.

The circuit board 40 includes a first cutout 40A and a second cutout 40B. The first motor terminal 26A protruding from the case 22 passes through the first cutout 40A when the circuit board 40 is attached to the case 22. The second motor terminal 26B protruding from the case 22 passes through The second cutout 40B when the circuit board 40 is attached to the case 22.

The first terminal-connecting part 44A is arranged near an inner edge of the first cutout 40A. The second terminal-connecting part 44B is arranged near an inner edge of the second cutout 40B. A first contact element 52A is mounted on the first terminal-connecting part 44A. The first contact element 52A is electrically coupled to the first motor terminal 26A as the circuit board 40 is attached to the case 22. A second contact element 52B is mounted on the second terminal-connecting part 44B. The second contact element 52B is electrically coupled to the second motor terminal 26B as the circuit board 40 is attached to the case 22.

The first contact element 52A includes a main body configured to be welded to the first terminal-connecting part 44A, and a plate spring that protrudes from the main body and abuts the first motor terminal 26A. The second contact element 52B includes a main body configured to be welded to the second terminal-connecting part 44B, and a plate spring that protrudes from the main body and abuts the second motor terminal 26B.

The ground connection member 46 is arranged to cover substantially the entirety of an area on the circuit board 40, opposite another area on the circuit board 40 where the first and second input terminal members 42A and 42B are located across the rotational shaft 24 of the motor 20. The ground connection member 46 is also arranged around the rotational shaft 24 and extends to a substrate area between the first and second terminal connecting parts 44A and 44B.

In other words, the ground connection member 46 is arranged not only in the area on the circuit board 40, opposite the another area on the circuit board 40 where the first and second input terminal members 42A and 42B are located across a straight line that crosses the rotational shaft 24, but also arranged in the another area where the first and second input members 42A and 42B are located.

The ground connection member 46 includes, at two locations in the area, opposite the another area where the first and second input terminal members 42A and 42B are located across the rotational shaft 24 of the motor 20, a first screw hole 46A and a second screw hole 46B that are formed to pass through the circuit board 40. The ground connection member 46 includes, in the substrate area between the first and second terminal-connecting parts 44A and 44B, a third screw hole 46C that is formed to pass through the circuit board 40.

The circuit board 40 is fixed to the fixing tool 30 in the following manner. A first screw 56A having a head is inserted through the first screw hole 46A and screwed to a first internal thread 36A formed in the fixing tool 30. A second screw 56B having a head is inserted through the second screw hole 46B and screwed to a second internal thread 36B formed in the fixing tool 30. A third screw 56C having a head is inserted through the third screw hole 46C and screwed to a third internal thread 36C formed in the fixing tool 30.

The front surface of the circuit board 40 is a surface where the first and second input terminal members 42A and 42B, the first and second terminal-connecting parts 44A and 44B, and the ground connection member 46 are formed as the conductor patterns. The back surface of the circuit board 40 is situated opposite the front surface. The back surface of the circuit board 40 includes a conductor pattern 43 that is electrically coupled to the fixing tool 30. The conductor pattern 43 is arranged so as to maximize its contact area with the fixing tool 30 and is electrically coupled to the ground connection member 46 on the front surface.

As a consequence, if the circuit board 40 is fixed to the case 22 of the motor 20 via the fixing tool 30, the ground connection member 46 on the front surface of the circuit board 40 is electrically coupled to the case 22 via the conductor pattern 43 on the back surface of the circuit board 40 and the first to third screws 56A to 56C.

A first capacitor 60A configured to couple the ground connection member 46 with the first input terminal member 42A is mounted on the circuit board 40, at a location where the ground connection member 46 and the first input terminal member 42A are close to each other. A second capacitor 60B configured to couple the ground connection member 46 and the second input terminal member 42B is mounted on the circuit board 40, at a location where the ground connection member 46 and the second input terminal member 42B are close to each other.

The first and second capacitors 60A and 60B are configured to remove noise transmitted from the motor 20 to the first and second input terminals 50A and 50B. In the present embodiment, each of the first and second capacitors 60A and 60B includes a chip component without a lead wire.

The front surface of the circuit board 40 includes a first choke coil 62A configured to couple the first input terminal member 42A to the first terminal-connecting part 44A, and a second choke coil 62B configured to couple the second input terminal member 42B to the second terminal-connecting part 44B.

The first and second choke coils 62A and 62B are configured to reduce transmission of noise generated in the motor 20 from the first and second motor terminals 26A and 26B to the first and second input terminals 50A and 50B. Each of the first and second choke coils 62A and 62B is formed by winding a conductive wire around a rod-shaped ferrite core.

Thus, the first input terminal member 42A and the first terminal-connecting part 44A are coupled to each other in the minimum length of a straight line that corresponds to the length of the ferrite core in the first choke coil 62A. The second input terminal member 42B and the second terminal-connecting part 44B are coupled to each other in the minimum length of a straight line that corresponds to the length of the ferrite core in the second choke coil 62B.

Figure 5:
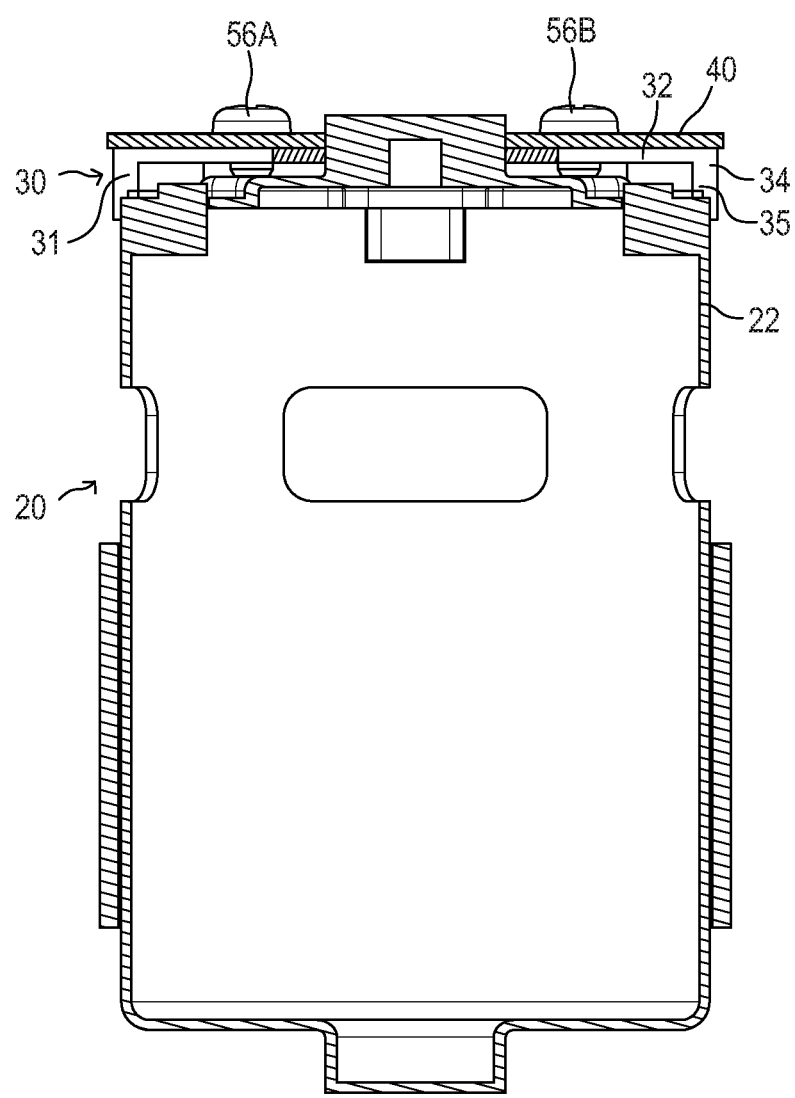
FIG. 5 is a sectional view of the motor taken along a line V-V in FIG. 3.
Figure 6:
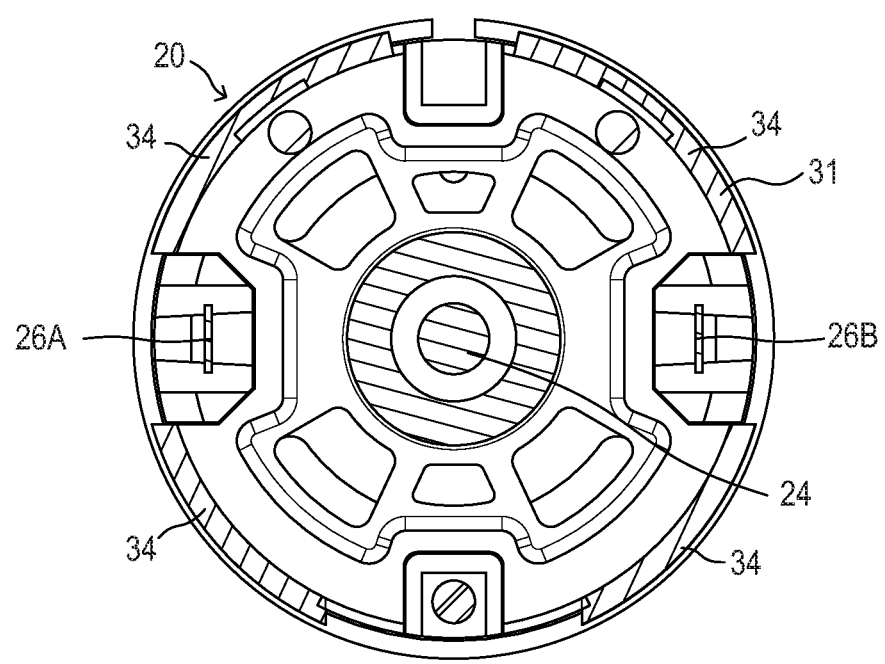
FIG. 6 is a sectional view of the motor taken along a line VI-VI in FIG. 2.

As shown in FIG. 4, FIG. 5, and FIG. 6, the fixing tool 30 includes a mount surface 32 configured for mounting the conductor pattern 43 arranged on the back surface of the circuit board 40, and a fitting frame 34 configured to be press-fitted over the case 22 of the motor 20.

The mount surface 32 approximately has a disc shape, substantially the same as the shape of the circuit board 40, and the outer periphery of the mount surface 32 includes partial cutouts to avoid contact with the first and second motor terminals 26A and 26B, the first and second terminal-connecting parts 44A and 44B, and energized parts of the circuit board 40.

The fitting frame 34 extends from uncut parts of outer periphery of the mount surface 32 in a direction opposite the direction the front surface of the circuit board 40 is facing.

Figure 7:
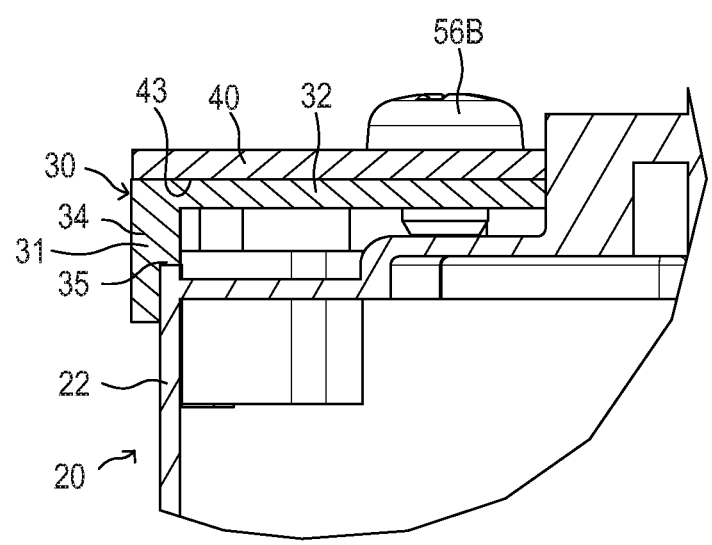
FIG. 7 is a sectional view of the motor taken along a line VII-VII in FIG. 3.

As shown in FIG. 5 and FIG. 7, a rib 35 is situated inside the fitting frame 34 in the fixing tool 30. The rib 35 abuts the end face of the case 22 when an end portion of the case 22 is press-fitted into the fitting frame 34, so that the rib 35 creates a space between the mount surface 32 and the case 22 to provide a passage for a cooling air.

Accordingly, in the present embodiment, attachment of the fixing tool 30 to the case 22 of the motor 20 can be a highly simple procedure since it only requires a press-fitting of the case 22 into the fitting frame 34. In addition, an increase of motor temperature due to confined heat between the motor 20 and the fixing tool 30 can be reduced since the rib 35 provides a space between the case 22 and the fixing tool 30 after the attachment.

As explained above, in the power tool 1 in the present embodiment, the circuit board 40, mounted with the first and second capacitors 60A and 60B and the first and second choke coils 62A and 62B for noise reduction, is fixed to the case 22 of the motor 20 as the power source via the fixing tool 30.

The circuit board 40 includes, as the conductor patterns, the first input terminal member 42A including the first input terminal 50A, the second input terminal member 42B including the second input terminal 50B, the first terminal-connecting part 44A coupled to the first motor terminal 26A via the first contact element 52A, the second terminal-connecting part 44B coupled to the second motor terminal 26B via the second contact element 52B, and the ground connection member 46.

The first input terminal member 42A is coupled to the ground connection member 46 via the first capacitor 60A, and the second input terminal member 42B is coupled to the ground connection member 46 via the second capacitor 60B. The first input terminal member 42A is coupled to the first terminal-connecting part 44A via the first choke coil 62A, and the second input terminal member 42B is coupled to the second terminal-connecting part 44B via the second choke coil 62B.

The ground connection member 46 is electrically coupled to the case 22 of the motor 20 via the fixing tool 30. The ground connection member 46 is arranged extensively on the circuit board 40 from the area, opposite the another area where the first and second input terminals 50A and 50B are located across the rotational shaft 24 of the motor 20, to the another area that includes the first and second input terminals 50A and 50B. The ground connection member 46 is coupled to the first and second input terminal members 42A and 42B respectively via the first and second capacitors 60A and 60B that are configured with the chip components.

As a consequence, in the present embodiment, the first and second capacitors 60A and 60B can be mounted in the motor 20 without extending the conductor patterns of the first and second input terminal members 42A and 42B to the substrate area in the area, opposite the another area where the first and second input terminals 50A and 50B are located across the rotational shaft 24, as conventionally configured.

This helps shorten the length of the wirings required to mount the first and second capacitors 60A and 60B and reduce the impedance of the wire elements by the shortened wire length to improve the noise reduction effect. Particularly, the noise reduction effect can be further improved since each of the first and second capacitors 60A and 60B in the present embodiment is configured with a chip component without a lead wire.

Each of the first and second choke coils 62A and 62B is a coil having a linear shape and is configured with a rod-shaped core wound with a conductive wire, so that the first and second input terminal members 42A and 42B are respectively coupled to the first and second terminal-connecting parts 44A and 44B in the minimum length of straight lines.

This helps shorten the length of the wiring patterns and the lead wires for mounting the first and second choke coils 62A and 62B, thereby reducing the impedance of the wiring patterns and the lead elements.

The power tool 1 of the present embodiment can therefore reduce noise transmitted or radiated from the motor 20 during the drive of the motor 20 more effectively than a power tool using the aforementioned conventional motor.

Figure 8:
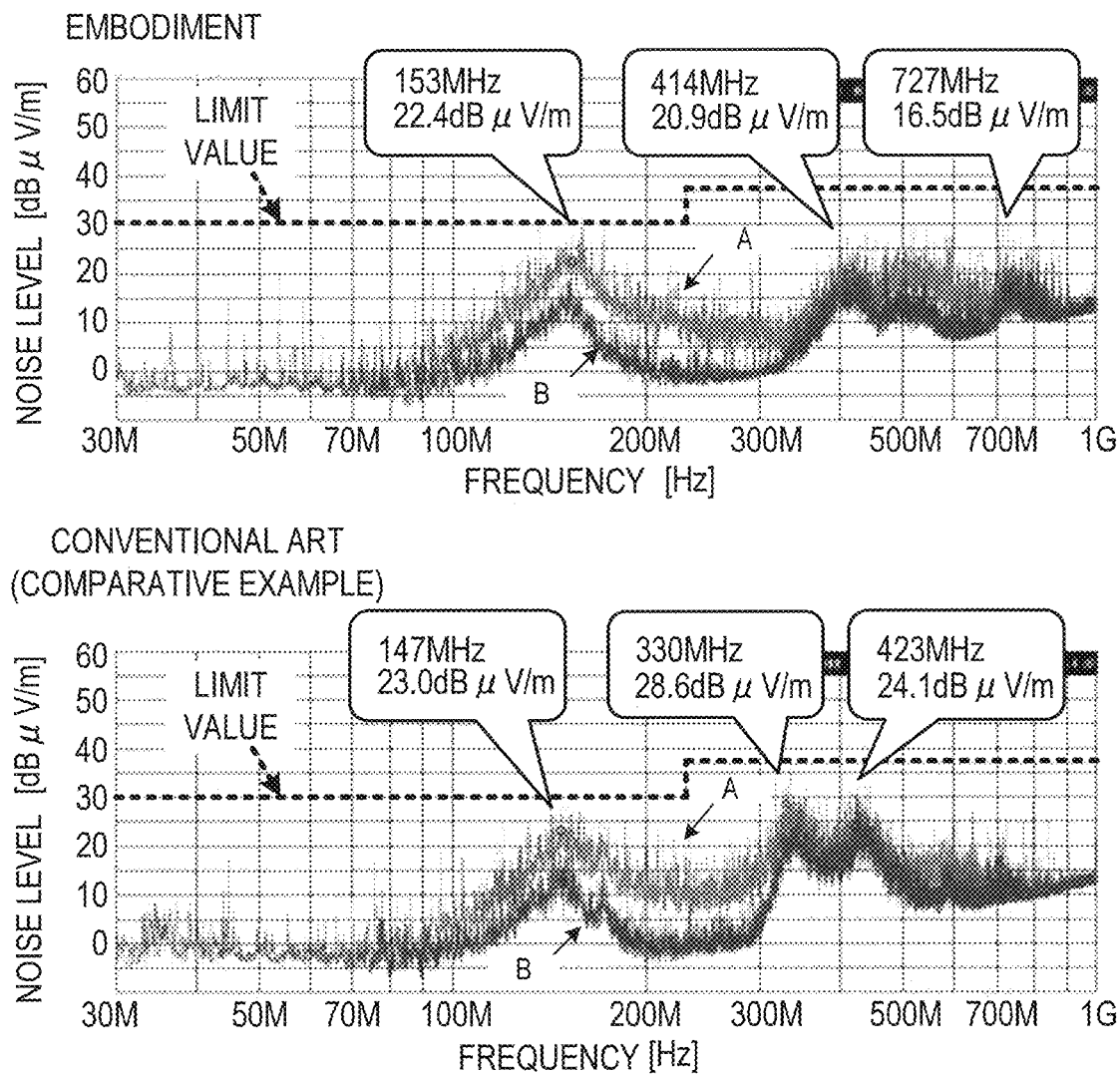
FIG. 8 is an explanatory diagram showing a noise reduction effect of the motor in the embodiment and a motor in a conventional example in comparison.

To survey the noise reduction effect by the power tool 1 of the present embodiment, radiated noise of the power tool 1 and radiated noise of a conventional power tool with a conventional circuit board (conventional art) are measured. FIG. 8 shows the result of each measurement.

The radiated noise is measured by receiving noise radiated from the power tool 1 or the conventional power tool during the drive of the motor via an antenna arranged to have a horizontal polarization plane (corresponding to "A" in FIG. 8) and an antenna arranged to have a vertical polarization plane (corresponding to "B" in FIG. 8), and transmitting received signals to an EMI receiver.

FIG. 8 shows a noise level (peak value) obtained by the EMI receiver at every specified frequency within the range from 30 MHz to 1 GHz. The upper diagram shows the result of measurement of the power tool 1 in the present embodiment, and the lower diagram shows the result of measurement of the conventional power tool.

For the measurement, the conventional power tool was configured with the circuit board 40 of the power tool 1 in the present embodiment with a ground terminal situated in the area, opposite the another area where the first and second input terminals 50A and 50B are located across the rotational shaft 24 of the motor 20, and the ground terminal is coupled to the first and second input terminal members 42A and 42B via capacitors having lead wires.

According to the results of measurements shown in FIG. 8, the noise level of the power tool 1 in the present embodiment has improved by approximately 7 dB or more in the frequency range from 300 MHz to 500 MHz compared with the conventional power tool.

The embodiment of the present disclosure has been explained herein but should not be interpreted as any limitation to the present disclosure. The present disclosure may be achieved in various modifications of the aforementioned embodiment.

For example, in the aforementioned embodiment, the circuit board 40 is explained to be mounted on the mount surface 32 of the fixing tool 30 and fixed with the first, second, and third screws 56A, 56B, and 56C to be electrically coupled to the fixing tool 30.

However, such a mere mounting of the circuit board 40 on the mount surface 32 of the fixing tool 30 can increase the impedance at connected portions of the circuit board 40 and the mount surface 32 due to, for example, some unwanted substances caught in a space between the connected portions.

To reduce the impedance through surface conduction between facing surfaces of the circuit board 40 and the fixing tool 30, an intervening substance may be disposed between the circuit board 40 and the fixing tool 30 to support the electric connection.

The intervening substance may be an elastic member having conductivity, such as a conductive rubber. Alternatively, conductive grease may be used to help facilitate the surface conduction between the circuit board 40 and the fixing tool 30.

For example, as indicated with a dotted-line arrow in FIG. 4, by a simple application of conductive grease 70 on the mount surface 32 of the fixing tool 30 and then placing the circuit board 40 on the mount surface 32, the surface conduction between the circuit board 40 and the fixing tool 30 can be established with a reduced impedance at the connected portions, and the noise reduction effect can be improved.

In the aforementioned embodiment, the ground connection member 46 is explained as extending on the circuit board 40 from the area, opposite the another area where the first and second input terminal members 42A and 42B are located, to the another area, and these areas can be defined by dividing the circuit board 40 with a straight line that crosses the rotational shaft 24 of the motor 20.

Alternatively, the ground connection member 46 may be formed on the circuit board 40 only in the another area where the first and second input terminal members 42A and 42B are located among the areas defined by dividing the circuit board 40 with a straight line that crosses the rotational shaft 24 of the motor 20.

This configuration still enables reduction of the length of wirings of the first and second capacitors 60A and 60B by mounting the first and second capacitors 60A and 60B on the circuit board 40 in the another area where the first and second input terminal members 42A and 42B are located. Therefore, the same effect as the aforementioned embodiment can be obtained.

In the aforementioned embodiment, it is explained that the power tool 1 is attached with the battery pack 6 and operates on electric power supplied by the battery pack 6. Alternatively, the electric power supply such as the battery pack 6 may be provided separately from the power tool 1 as an external electric power supply. In this case, the power tool 1 may be configured to receive the power supply from the external electric power supply via a power transmission line. The external electric power supply may also be an alternating current (AC) power supply such as a commercial power supply.

In the aforementioned embodiment, it is explained that the motor 20 is a brushed DC motor. Nevertheless, the motor 20 may also be other DC motor such as a brushless motor, or an AC motor.

In the aforementioned embodiment, the power tool 1 (rechargeable impact driver) that includes the impact mechanism driven by the motor 20 was used as an example of the electric working machine in the present disclosure. Nevertheless, the electric working machine in the present disclosure should not be limited to the aforementioned power tool 1. The same effect as the aforementioned embodiment can be achieved with any electric working machine that includes a motor as a power source by an application of the present disclosure as in the aforementioned embodiment.

In the aforementioned embodiment, two or more functions of one element in the aforementioned embodiment may be achieved by two or more elements, or one function of one element may be achieved by two or more elements. Two or more functions of two or more elements may be achieved by one element, or one function achieved by two or more elements may be achieved by one element. A part of the configuration of the aforementioned embodiment may be omitted. At least a part of the configuration of the aforementioned embodiment may be added to or replaced with another part of the configuration of the aforementioned embodiment. It should be noted that any and all modes encompassed in the technical ideas that are defined by only the languages in the claims are embodiments of the present disclosure.

What is claimed is:

1. An electric working machine comprising:
    a motor,
    a circuit board,
    capacitors and choke coils mounted on the circuit board for noise reduction, and
    a fixing tool that fixes the circuit board to a portion of a case of the motor, the portion of the case being located in a first end of the motor, in an axial direction of a rotational shaft of the motor, and including motor terminals for power feed, wherein
    the circuit board includes, as conductor patterns,
        input terminal members configured to receive an externally supplied driving power for the motor, and
        a ground connection member that is electrically coupled to the portion of the case,
    the capacitors are mounted on the circuit board to couple the input terminal members to the ground connection member respectively,
    the choke coils are mounted on the circuit board to couple the input terminal members to the motor terminals respectively,
    the ground connection member is in a certain area of the circuit board, the certain area being one of areas on the circuit board defined by dividing the circuit board with a straight line that crosses the rotational shaft of the motor, the certain area also being an area where the input terminal members are located, and
    the capacitors are mounted in the certain area.

2. The electric working machine of claim 1, wherein each of the capacitors includes a chip component.

3. The electric working machine of claim 1, wherein the circuit board includes, as the conductor patterns, terminal-connecting parts that are coupled to the motor terminals via contact elements.

4. The electric working machine of claim 3, wherein the choke coils are mounted on the circuit board to couple the input terminal members to the terminal-connecting parts.

5. The electric working machine of claim 1,
    wherein each of the choke coils includes a rod-shaped core wound with a conductive wire, and
    wherein the choke coils couple the input terminal members to terminal-connecting parts in straight lines.

6. The electric working machine of claim 1,
    wherein the fixing tool includes a conductor, and
    wherein the ground connection member of the circuit board is electrically coupled to the portion of the case of the motor via the fixing tool.

7. The electric working machine of claim 6,
wherein the circuit board includes, on its back surface, a conductor that is electrically coupled to the ground connection member on a front surface of the circuit board, wherein the front surface of the circuit board is a surface where the capacitors and the choke coils are mounted, and wherein the back surface is opposite the front surface, and
wherein the ground connection member is electrically coupled to the portion of the case of the motor via the fixing tool as the circuit board is mounted on the fixing tool to cause the conductor on the back surface to contact the fixing tool.

8. The electric working machine of claim 6, wherein the circuit board is fixed to the fixing tool via a screw that is inserted through a screw hole formed in the ground connection member.

9. The electric working machine of claim 6, further comprising an intervening substance disposed between the circuit board and the fixing tool to support an electric connection between the circuit board and the fixing tool.

10. The electric working machine of claim 1,
wherein the fixing tool includes a fitting frame that is externally fitted to the portion of the case of the motor, and
wherein the fixing tool is fixed to the motor by press-fitting the portion of the case of the motor into the fitting frame.

11. The electric working machine of claim 10,
wherein the fixing tool includes a rib in the fitting frame, and
wherein the rib abuts an end face of the case of the motor when the portion of the case of the motor is press-fitted into the fitting frame so as to create a space between the fixing tool and the motor to provide a passage for a cooling air.

12. The electric working machine of claim 1, wherein the input terminal members include input terminals that receive an externally supplied driving power for the motor.

13. An electric working machine comprising:
a motor including:
a case including a central axis,
a shaft oriented along the central axis,
a first motor terminal protruding from a front face of the motor, and
a second motor terminal protruding from the front face of the motor, and located opposite the first motor terminal with respect to the central axis;
a fixing tool attached to the case, and configured to pass the first and second motor terminals without contacting them, wherein the fixing tool includes:
a mount surface,
an internal thread orthogonal to the mount surface,
a first central hole coaxial with the shaft and configured to pass the shaft;
a circuit board mounted to the mount surface and including:
a screw hole aligned with the internal thread,
a first cutout configured to pass the first motor terminal,
a second cutout configured to pass the second motor terminal,
an attachment extending radially beyond the case,
a second central hole coaxial with the shaft and configured to pass the shaft,
five conduction patterns located on a front surface of the circuit board, the five conduction patterns including:
a ground connection member surrounding the screw hole and the second central hole,
a first terminal-connecting part located adjacent to the first cutout and adjacent to the ground connection member,
a second terminal-connecting part located adjacent to the second cutout and adjacent to the ground connection member,
a first input terminal member located adjacent to the ground connection member and located at least partly on the attachment, and
a second input terminal member located adjacent to the ground connection member and located at least partly on the attachment.

14. The electric working machine of claim 13, further comprising:
a first choke coil including:
a first attachment end lead that is electrically connected to the first input terminal member, and
a first terminal end lead that is electrically connected to the first terminal-connecting part; and
a second choke coil including:
a second attachment end lead that is electrically connected to the second input terminal member, and
a second terminal end lead that is electrically connected to the second terminal-connecting part,
wherein the first choke coil includes:
a first ferrite core with a first length, and
a first conductive wire,
wherein the second choke coil includes:
a second ferrite core with a second length, and
a second conductive wire,
wherein the first choke coil is oriented such that:
a first distance between the first input terminal member and the first terminal-connecting part is ≤ the first length, and
wherein the second choke coil is oriented in a substantial mirror image of the first choke coil.

15. The electric working machine of claim 13, further comprising:
a first choke coil including:
a first attachment end lead that is electrically connected to the first input terminal member, and
a first terminal end lead that is electrically connected to the first terminal-connecting part; and
a second choke coil including:
a second attachment end lead that is electrically connected to the second input terminal member, and
a second terminal end lead that is electrically connected to the second terminal-connecting part,
wherein the first choke coil includes:
a first ferrite core with a first length, and
a first conductive wire,
wherein the second choke coil includes:
a second ferrite core with a second length, and
a second conductive wire,
wherein the first ferrite core is located partly over the first input terminal member and partly over the first terminal-connecting part, and
wherein the second ferrite core is located partly over the second input terminal member and partly over the second terminal-connecting part.

16. The electric working machine of claim 14,
wherein the first input terminal member:
is substantially rectangular,
extends into a first corner of the attachment, and includes a first input terminal located over the attachment, and wherein the second input terminal member is substantially a mirror image of the first input terminal member.

17. The electric working machine of claim 16,
wherein the first terminal-connecting part:
is substantially L-shaped,
has a first interior edge adjacent to the first cutout, and
has a second interior edge adjacent to the first cutout, and
wherein the second terminal-connecting part is substantially a mirror image of the first terminal-connecting part.

18. The electric working machine of claim 17, further comprising:
a first capacitor electrically connecting the first input terminal member with the ground connection member;
a second capacitor electrically connecting the second input terminal member with the ground connection member;
a first contact element electrically connecting the first terminal-connecting part with the first motor terminal,
a second contact element electrically connecting the second terminal-connecting part with the second motor terminal, and
wherein the first contact element includes:
a first main body welded to the first terminal-connecting part, and
a first plate spring connected to the first motor terminal, and wherein the second contact element includes:
a second main body welded to the second terminal-connecting part, and
a second plate spring connected to the second motor terminal.

19. The electric working machine of claim 18,
wherein the fixing tool further includes:
a tongue extending radially outward and located underneath the attachment of the circuit board,
a first tongue cutout located adjacent to the tongue and located underneath the first input terminal member,
a second tongue cutout located adjacent to the tongue and located underneath the second input terminal member, and
a fitting frame projecting parallel to the central axis that mates with the case,
wherein the fitting frame includes a rib that seats against a first edge of the case such that the circuit board is displaced axially from the case and such that a cooling air flow is facilitated, and
wherein the fitting frame includes a circumferential portion that contacts an outer surface of the case and orients the circuit board coaxially with the central axis.

* * * * *